United States Patent
Eddy et al.

(10) Patent No.: US 6,241,530 B1
(45) Date of Patent: Jun. 5, 2001

(54) BACKPLANE ASSEMBLY FOR PRINTED CIRCUIT BOARDS

(75) Inventors: Brett A. Eddy, Phoenix; Jason L. Glithero, Mesa, both of AZ (US)

(73) Assignee: Honeywell Inc., Minneapolis, MN (US)

( * ) Notice: Subject to any disclaimer, the term of this patent is extended or adjusted under 35 U.S.C. 154(b) by 0 days.

(21) Appl. No.: 08/992,020

(22) Filed: Dec. 17, 1997

(51) Int. Cl.[7] .................................................. H01R 9/09
(52) U.S. Cl. ............................................. 439/61; 361/788
(58) Field of Search .......................... 439/61, 62; 361/788

(56) References Cited

U.S. PATENT DOCUMENTS

| | | |
|---|---|---|
| 4,477,862 | 10/1984 | Gonzales . |
| 4,685,032 | 8/1987 | Blomstedt et al. . |
| 4,689,721 | 8/1987 | Damerow et al. . |
| 4,846,699 | 7/1989 | Glover et al. . |
| 5,351,019 | 9/1994 | McHugh et al. . |
| 5,488,541 * | 1/1996 | Mistry et al. ........................... 439/61 |
| 5,495,583 * | 2/1996 | Townsend et al. ...................... 439/61 |
| 5,495,584 | 2/1996 | Holman, Jr. et al. . |
| 5,505,627 * | 4/1996 | Honma ................................... 439/61 |
| 5,525,063 * | 6/1996 | McMichen et al. .................... 439/61 |
| 5,547,386 | 8/1996 | Fredberg . |
| 5,603,044 | 2/1997 | Annapareddy et al. . |
| 5,903,442 * | 5/1999 | Kanai et al. .......................... 361/788 |

* cited by examiner

*Primary Examiner*—Neil Abrams
*Assistant Examiner*—Hae Moon Hyeon
(74) *Attorney, Agent, or Firm*—Snell & Wilmer

(57) ABSTRACT

The present invention is a backplane for printed circuit board modules. The backplane includes first and second redundant, signal transmission channels. Multiple pairs of substantially identical first and second connectors are mounted on the backplane. The first connector of each of the multiple pairs is connected to the first channel and the second connector is connected to the second channel. The first and second connectors each have a long dimension and a short dimension, and are positioned on the backplane with the first connector above the second connector and with the short dimensions of the first and second connectors being most proximate. Modules connected to the second connectors of are oriented substantially 180° opposite to the modules connected to the first connectors. This allows modules on the first channel to be quickly discerned from the modules of the second channel.

12 Claims, 2 Drawing Sheets

BACKPLANE ASSEMBLY FOR PRINTED CIRCUIT BOARDS

BACKGROUND OF THE INVENTION

This invention relates to electronic systems. In particular, the present invention is a backplane assembly for an electronic system chassis, wherein the backplane assembly incorporates connectors for a variety of printed circuit board modules in a multiple channel architecture.

The general construction and operation of electronic systems for an electronic device necessitates that a plurality of printed circuit board modules, such as input/output (I/O) modules be electronically connected to one or more central processing units. In order to achieve this electronic connection, each I/O module electronically contacts a mother board, often referred to as a backplane board as it is vertically mounted as a back wall of an electronic system chassis. The backplane includes a plurality of connectors for releasably interconnecting with a mating connector along a rear edge of each of the I/O modules. Typically, a pair of opposed side walls of the chassis incorporate guide channels for providing lateral support to the I/O modules when interconnected with the backplane.

For fail/safe operation, as may be necessary in electronic devices of aircraft systems, construction of the electronic system necessitates the use of redundant I/O modules. Typically, to achieve such redundancy requires the use of two chassis, with each chassis having an identical set of I/O modules. Each backplane of the redundant chassis would be linked to the electronic device through its own signal transmitting bus or channel. In other words, I/O modules of one chassis would be linked to the electronic device through a so called "channel A", while the redundant, second chassis would be linked to the electronic device through a so called "channel B". Operational failure of an I/O module within the one chassis would only require switching from the inoperative channel A to the operative channel B of the operational redundant, second chassis, to maintain the operation of the electronic device. One drawback of this redundant chassis architecture, particularly with regard to aircraft where space is at a premium, is the space requirement for the chassis of the redundant, second set of I/O modules.

U.S. Pat. No. 5,547,386 to Fredberg in one way, addresses this redundant chassis, space requirement drawback of redundant channel electronic systems. In Fredberg, a single chassis, having a single backplane incorporating redundant sets of connectors is used. The backplane connectors for the I/O modules are arranged side by side, with adjacent backplane connectors alternating between channel A and a channel B. Though the backplane architecture of Fredberg eliminates the added bulk of the redundant, second chassis, there are some disadvantages to the Fredberg design. For example, since only a single backplane is used, it is difficult to discern which I/O modules are on channel A and which are on channel B. This difficulty is particularly evident when inoperative or damaged I/O modules of an inoperative channel need to be identified for repair or replacement. In addition, due to the alternating nature of the channel A and channel B backplane connectors of Fredberg, I/O modules of a common channel can not be arranged side by side. Moreover, the backplane scheme of Fredberg can not accommodate "ganging" (i.e., connecting multiple I/O modules directly together) of like I/O modules.

There is a need for improved redundant channel, backplane assemblies for chassis of electronic systems. In particular, there is a need for a redundant channel, backplane assembly wherein I/O modules on channel A can be quickly discerned from I/O modules on channel B. This would allow I/O modules of an inoperative channel (inoperative due to inoperative or damaged I/O modules) to be readily identified with respect to the operative I/O modules of the operative redundant channel. In addition, the redundant channel, backplane assembly should permit I/O modules of a common channel to be arranged side by side, and should accommodate ganging of like I/O modules. Lastly, the redundant channel, backplane assembly should be as compact as possible so as to be particularly suitable for use in aircraft or wherever space is at a premium.

SUMMARY OF THE INVENTION

The present invention is a backplane assembly for printed circuit board modules. The backplane assembly includes a backplane having first and second signal transmission channels. Multiple pairs of substantially identical first and second connectors are mounted on the backplane. The first connector of each of the multiple pairs is connected to the first signal transmission channel. The second connector of each of the multiple pairs is connected to the second signal transmission channel. The first and second connectors of the multiple pairs each have a long dimension and a short dimension, and are positioned on the backplane with the first connector above the second connector and with the short dimensions of the first and second connectors being most proximate.

Modules connected to the second connectors of the second channel are oriented substantially 180° opposite to the modules connected to the first connectors of the first channel. This allows modules on the first channel to be quickly discerned from the modules of the second channel. Therefore modules of an inoperative channel (inoperative due to inoperative or damaged modules) can be readily identified with respect to the operative modules of the operative channel, so that the inoperative modules can be repaired or replaced. This backplane assembly permits modules of a common channel to be arranged side by side, and accommodates ganging of like modules. In addition, this backplane assembly is compact so as to be particularly suitable wherever space is at a premium, such as in aircraft.

DETAILED DESCRIPTION OF THE PREFERRED EMBODIMENT

Figures 1, 2:
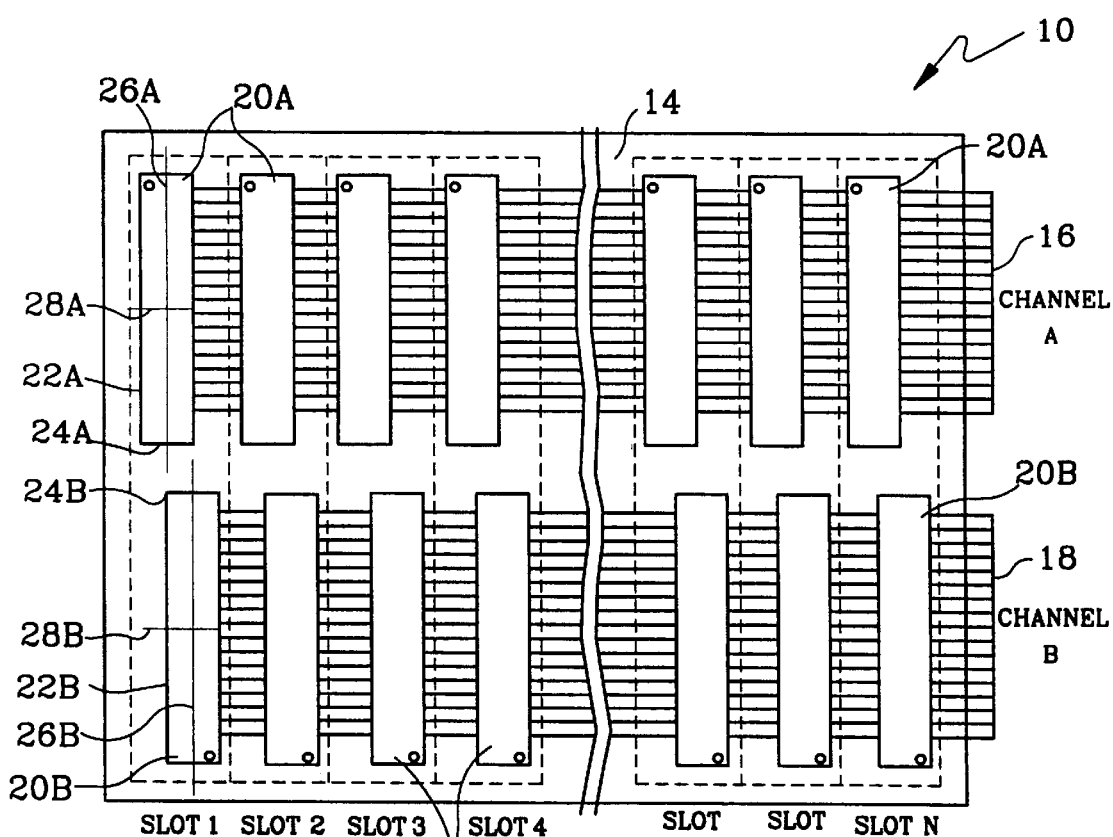
FIG. 1 is an elevational view of a backplane assembly for printed circuit board, input/output (I/O) modules in accordance with the present invention.
FIG. 2 is a perspective view of an I/O module.

A backplane assembly 10 for printed circuit board modules, such as input/output (I/O) modules 12 in accordance with the present invention is illustrated generally in FIGS. 1 and 2. The backplane assembly 10 includes a backplane 14, a first signal transmission channel 16 (channel "A") and a second signal transmission channel 18 (channel "B"). In one preferred embodiment, the first and second channels 16 and 18 are redundant channels for fail/safe mode operation of an electronic device (not shown).

The backplane assembly 10 further includes multiple pairs (defined by I/O module slots shown in dashed lines and labeled as slots "1" through "N" in FIG. 1) of substantially identical first and second connectors 20A and 20B, respectively, mounted on the backplane 14. Only some of the first and second connectors 20A and 20B are labeled for clarity. The first connector 20A of each of the multiple pairs is connected to the first channel 16, and the second connector 20B of each of the multiple pairs is connected to the second channel 18. Each of the first and second connectors 20A and 20B of the multiple pairs is generally rectangular in shape and has a long dimension 22A (first connector 20A) and 22B (second connector 20B), and a short dimension 24A (first connector 20A) and 24B (second connector 20B). In addition, each of the first and second connectors 20A and 20B of the multiple pairs has a longitudinal axis 26A (first connector 20A) and 26B (second connector 20B), and a lateral axis 28A (first connector 20A) and 28B (second connector 20B) that coincide with the long dimension 22A, B and the short dimension 24A, B, respectively.

As seen best in FIG. 1, the first connector 20A of each of the multiple pairs is mounted on the backplane 14 above its paired second connector 20B, with the short dimensions 24A and 24B being most proximate. In addition, the longitudinal axis 26A of the first connector 20A of each of the multiple pairs is spaced from (i.e., offset from), parallel to and non-coincident with the longitudinal axis 26B of its paired second connector 20B. Likewise, the lateral axis 28A of the first connector 20A of each of the multiple pairs is spaced from (i.e., offset from), parallel to and non-coincident with the lateral axis 28B of its paired second connector 20B.

As seen best in FIG. 2, each of the I/O modules 12 includes a printed circuit card 30 having electronic components 32 mounted thereon. A rear edge 34 of each of the circuit cards 30 has a rear edge connector 36 for releasably mating with any one of the first and second connectors 20A and 20B of the multiple pairs of the backplane 14. A front edge 38 of each of the circuit cards 30 has front plate 40 having a front plate input/output connector 42 thereon. The circuit card 30 of each of the I/O modules 12 is generally rectangular in shape and has a long dimension 44 and a short dimension 46. A longitudinal axis 48 of each of the I/O modules 12 coincides with the long dimension of the circuit cards 30.

Figure 3:
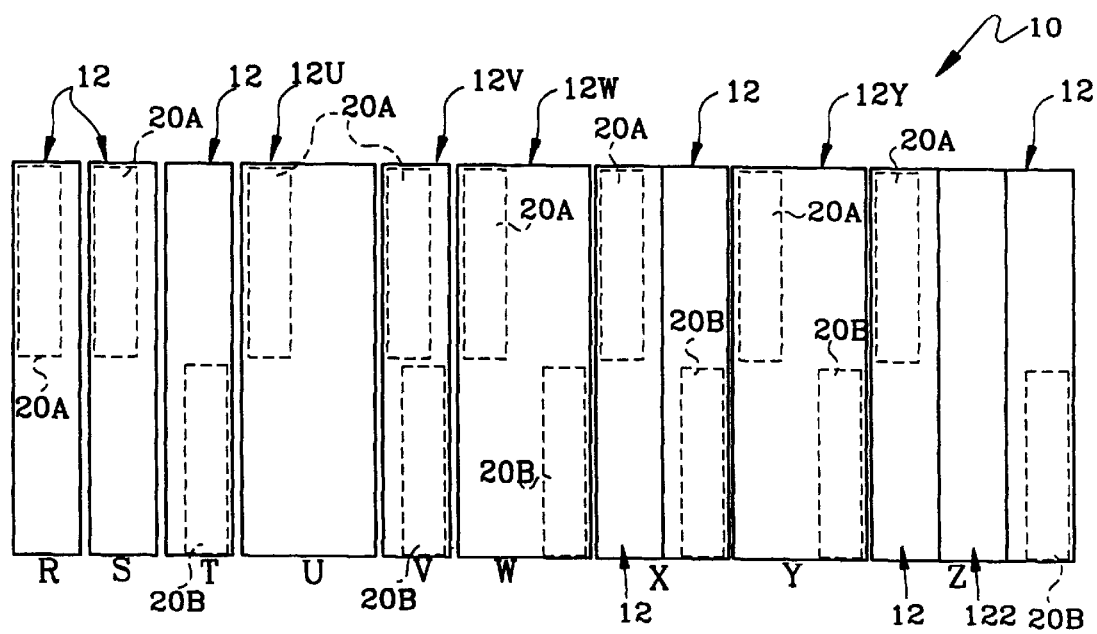
FIG. 3 is an elevational view illustrating the varied I/O module architectures used for mating with the backplane assembly of FIG. 1.

In practice, when rear edge connector 36 of an I/O module 12 is mated with any one of the second connectors 20B of the multiple pairs, the I/O module 12 is oriented in a first orientation as shown in FIG. 2 and example "T" of FIG. 3. In this first orientation, the rear edge connector 36 is below the longitudinal axis 48 of the I/O module 12. To mate the rear edge connector 36 of the same I/O module 12 with any one of the first connectors 20A of the multiple pairs, the I/O module 12 need only be rotated (i.e., flipped) 180° from the first orientation about its longitudinal axis 48 before connecting the I/O module 12 to the first connector 20A. This orientation of the I/O module 12 (i.e., rotated 180° from the first orientation) is referred to as the second orientation of the I/O module 12 and is illustrated in both examples "R" and "S" in FIG. 3. In this second orientation, the rear edge connector 36 is above the longitudinal axis 48 of the I/O module 12.

Since the second orientation of the I/O module 12 is rotated 180° relative to the first orientation of the I/O module 12, the position of rear edge connector 36 and front plate connector 42 of a module 12 in the first orientation is opposite to the position of rear edge connector 36 and front plate connector 42 of a module 12 in the second orientation. This opposite positioning allows someone to quickly and easily discern an I/O module 12 connected to the first channel 16 (second orientation) from an I/O module 12 connected to the second channel 18 (first orientation). Therefore I/O modules of an inoperative channel (inoperative due to inoperative or damaged I/O modules) can be readily identified with respect to the operative I/O modules of the operative channel, so that the inoperative I/O modules can be repaired or replaced. In addition because each of the slots "1" through "N" can accommodate an I/O module on either the first channel 16 or the second channel 18, I/O modules on a common channel can be placed side by side as illustrated by examples "R" and "S" in FIG. 3. In addition, I/O modules 12 on different channels can be alternated as illustrated by examples "S" and "T" in FIG. 3. Moreover, any combination of examples "R", "S" and "T" could be used and one could still quickly and easily discern an I/O module 12 on the first channel 16 from an I/O module 12 on the second channel 18.

FIG. 3 also illustrates further examples of I/O module architecture. Example "U" illustrates a custom I/O module 12U that connects to a single channel and has a double slot width. Example "V" illustrates a custom I/O module 12V that connects to both channels 16 and 18 and has a single slot width. Example "W" illustrates a custom I/O module 12W that connects to both channels 16 and 18 and has a double slot width. Example "Y" is similar to example "W" but illustrates a custom I/O module 12Y that connects to both channels 16 and 18 and has more than a double slot width (a triple slot width being shown).

Figure 4:
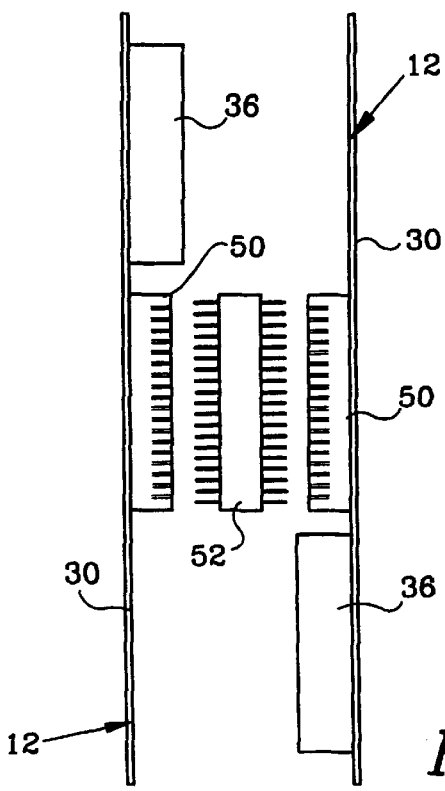
FIG. 4 is an elevational view illustrating the "ganging" of like I/O modules in accordance with the present invention.

Examples "X" and "Z" of FIG. 3 illustrate "ganging" of like I/O modules 12. As seen in example "X" and FIG. 4, the I/O modules 12 can include further connectors 50 that would allow one I/O module 12, in the first orientation, to be connected to a second like I/O module 12, in the second orientation, via an intermediate connector 52 that mates with the further connectors 50 of both oppositely oriented I/O modules 12. This combined I/O module would have a double slot width and be connected to both of the first and second channels 16 and 18. As shown in example "Z", a center I/O module 12Z could be substituted for the intermediate connector 52, thereby forming a combined I/O module that connects to both channels 16 and 18 and has more than a double slot width (a triple slot width being shown).

The backplane assembly 10 of the present invention allows I/O modules 12 connected to the first channel 16 to be quickly discerned from the I/O modules 12 connected to the second channel 18. In addition, this backplane assembly 10 permits I/O modules 12 of a common channel to be arranged side by side, and accommodates ganging of like I/O modules 12. Moreover, this backplane assembly 10 has a compact architecture so as to be particularly suitable wherever space is at a premium, such as in aircraft.

Although the present invention has been described with reference to preferred embodiments, workers skilled in the art will recognize that changes may be made in form and detail without departing from the spirit and scope of the invention.

We claim:

1. A backplane assembly for printed circuit board modules, comprising:
   a backplane;
   a first signal transmission channel;
   a second signal transmission channel;
   multiple pairs of substantially identical first and second connectors mounted on the backplane, the first connector of each of the multiple pairs being connected to the first signal transmission channel and the second connector of each pair of the multiple pairs being connected to the second signal transmission channel, wherein each of the first and second connectors of the multiple pairs has a long dimension and a short dimension, and wherein the first connector of each of the multiple pairs is positioned on the backplane above the second connector of each of the multiple pairs with the short dimensions of the first and second connectors being most proximate; and a plurality of printed circuit board modules, each module of the plurality of modules having a long dimension, a short dimension, a longitudinal axis that coincides with the long dimension, and an edge connector for mating with any one of the first and second connectors of the multiple pairs;

wherein any one of the plurality of modules is in a first orientation when connected to any one of the first connectors of the multiple pairs and in a second orientation when connected to any one of the second connectors of the multiple pairs, and wherein the one of the plurality of modules in the second orientation is rotated substantially 180° about its longitudinal axis relative to the module in the first orientation, such that the module connected to the first signal transmission channel can be easily discerned from the module connected to the second signal transmission channel.

2. The backplane assembly of claim 1 wherein each of the first and second connectors of the multiple pairs has a longitudinal axis and a lateral axis that coincide with the long dimension and short dimension, respectively, and wherein the longitudinal axis of the first connector of each of the multiple pairs is spaced from, parallel to and non-coincident with the longitudinal axis of the second connector of each of the multiple pairs.

3. The backplane assembly of claim 2 wherein the lateral axis of the first connector of each of the multiple pairs is spaced from, parallel to and non-coincident with the lateral axis of the second connector of each of the multiple pairs.

4. The backplane assembly of claim 3 wherein each of the multiple pairs of the first and second connectors defines a module slot on the backplane.

5. The backplane assembly of claim 4 wherein at least one of the plurality of modules includes a connector joining two of said modules, one of which is in the first orientation and the other of which is in the second orientation, such that said two of said modules are connected together and to the backplane so as to communicate with both the first and second signal transmission channels.

6. The backplane assembly of claim 5 wherein the connector is one of an intermediate connector and a center module.

7. The backplane assembly of claim 4 wherein the modules of the plurality of modules can be connected to one of the first and second channels of each slot.

8. The backplane assembly of claim 4 wherein the modules of the plurality of modules can be connected to both of the first and second channels of each slot.

9. The backplane assembly of claim 4 wherein the modules of the plurality of modules can be connected to both of the first and second channels of at least two slots.

10. The backplane assembly of claim 1 wherein the first and second signal transmission channels are redundant channels for fail/safe mode of operation.

11. A backplane assembly comprising:

a backplane;

a first signal transmission channel;

a second signal transmission channel;

a pair of substantially identical first and second connectors mounted on the backplane, the first connector of said pair being coupled to the first signal transmission channel and the second connector of said pair being coupled to the second signal transmission channel; and a plurality of printed circuit board modules, each module of the plurality of modules having a longitudinal axis;

wherein a first module of said plurality of modules is configured to be mounted in said first connector, and a second module of said plurality of modules is configured to be mounted in said second connector such that said second module is rotated about its longitudinal axis relative to the first module.

12. The backplane assembly of claim 11 wherein the second module is rotated substantially 180° about its longitudinal axis relative to the first module.

* * * * *